United States Patent [19]

Carobolante

[11] Patent Number: 5,453,905
[45] Date of Patent: Sep. 26, 1995

[54] CIRCUIT FOR INCREASING THE BREAKDOWN VOLTAGE OF A BIPOLAR TRANSISTOR

[75] Inventor: Francesco Carobolante, San Jose, Calif.

[73] Assignee: SGS-Thomson Microelectronics, Inc., Carrollton, Tex.

[21] Appl. No.: 992,488

[22] Filed: Dec. 17, 1992

[51] Int. Cl.⁶ .................................................. H03K 5/00
[52] U.S. Cl. .......................... 361/152; 327/432; 327/427; 327/379
[58] Field of Search ..................................... 361/154, 160, 361/8, 86; 323/289; 363/55–56; 307/570, 571–572, 584; 327/432, 427, 379, 434

[56] References Cited

U.S. PATENT DOCUMENTS

| 4,705,322 | 11/1987 | Yiannoulos | 361/91 |
| 4,706,159 | 11/1987 | Hafner | 361/93 |
| 4,968,953 | 11/1990 | Kanda et al. | 331/65 |
| 5,075,568 | 12/1991 | Bilotti et al. | 307/270 |

FOREIGN PATENT DOCUMENTS 63-276324  11/1988  Japan ............................. H03K/17/66

OTHER PUBLICATIONS

The Transistor and Diode Data Book, 1973, 4–94, 4–95, Texas Instrument Incorporated.

*Primary Examiner*—Steven L. Stephan
*Assistant Examiner*—Aditya Krishnan
*Attorney, Agent, or Firm*—Richard A. Bachand; Lisa K. Jorgenson; Richard K. Robinson

[57] ABSTRACT

A circuit for increasing the reverse breakdown voltage of a bipolar transistor that provides drive current to an inductor has a voltage control transistor connected between the collector and base of the bipolar transistor, having a control element connected to one end of the inductor. The circuit can be fabricated as a portion of an integrated circuit formed on a single semiconductor substrate. Also disclosed is a method for increasing the emitter-collector breakdown voltage of a bipolar transistor in which the base and collector of the bipolar transistor are shorted when the emitter-collector voltage exceeds the breakdown voltage by turning on a transistor connected between the base and collector of the bipolar transistor.

13 Claims, 1 Drawing Sheet

CIRCUIT FOR INCREASING THE BREAKDOWN VOLTAGE OF A BIPOLAR TRANSISTOR

BACKGROUND OF THE INVENTION

1. Field of the Invention

This invention pertains to improvements in electronic circuits, and, more particularly, to improvements in electronic circuits that provide a driving current to an inductive load and to provisions for increasing the breakdown voltage of the circuit beyond that of the reverse breakdown voltage of its bipolar driver transistor.

2. Description of the Relevant Art

With reference to FIG. 1, a circuit 10 that is typical of prior art circuits for providing drive current to an inductor or inductive load 11 is shown. The circuit 10 includes an NPN transistor 14 having its collector connected to a power supply that supplies a voltage, $V_{CC}$. The emitter of the transistor 14 is connected to a node, N1 to which one end of an inductor 11 is also connected. Additional resistive and other loading elements are shown by a block 16, connected between the other end of the inductor 11 and a voltage, $V_S$.

A switch 17 is connected between the node, N1, and ground. The switch 17 is controlled to be on or off by a signal applied to an input terminal 18. The switch 17, typically is provided by a transistor, such as an n-Channel MOS or bipolar NPN transistor, with the gate or base, respectively, connected to the input 18.

The circuit is controlled by a signal on an input 20 connected to the base of the NPN driver transistor 14. Thus, it can be seen that the arrangement of the transistor 14 and switch 17 provides a push-pull drive scheme to the inductor 11. When, however, the switch 17 is turned off, the inductor 11 will attempt to continue the current flowing within its coils in the same direction as it was flowing preceding the turn off of the switch 17. Therefore, the voltage at the node N1 may in fact exceed the power supply voltage $V_{CC}$ to a point at which the reverse breakdown voltage of the transistor 14 is exceeded.

Some circuits provide clamping or other circuit mechanisms to control the excess voltage generated by the action of the inductor 11 at node N1.

On the other hand, in many applications the increased voltage is allowed to climb as far as possible so that the inductor may discharge its energy faster. The discharge may be practically limited by the reverse breakdown voltage of transistor 14.

Two reverse breakdown voltages are of interest. The first, $BV_{ECO}$, is the one which is obtained by raising (in an NPN transistor) the voltage of the emitter with respect to the voltage of the collector and leaving the base terminal unconnected. The second, $BV_{EBO}$, is the one obtained by raising the potential of the emitter with respect to that of the base and leaving the collector floating or at a potential equal or higher than the base. The second is always higher than the first and often twice as large.

To allow the voltage on node N1 to raise above the supply, transistor 14 is usually left undriven, (i.e., high impedance) so that its base is floating and the voltage on node N1 cannot raise more than the $BV_{ECO}$ of 14 above the supply.

SUMMARY OF THE INVENTION

In light of the above, therefore, it is an object of the invention to provide an improved circuit for providing drive current to an inductive load.

It is another object of the invention to provide a circuit of the type described that enables voltages larger than the emitter-collector breakdown voltage of a driver transistor to exist on the transistor without causing its breakdown.

It is another object of the invention to provide a circuit for use in driving dc motors or the like that increases the reverse breakdown voltage on the high side driver transistors.

It is yet another object of the invention to provide a method for increasing the reverse breakdown voltage on a bipolar transistor.

These and other objects, features and advantages of the invention will be apparent to those skilled in the art from the following detailed description of the invention, when read in conjunction with the accompanying drawings and appended claims.

In accordance with a broad aspect of the invention, a circuit for increasing the reverse breakdown voltage of a bipolar transistor that provides drive current to an inductor is presented. The circuit has a voltage control transistor connected between the collector and base of the bipolar transistor, having a control element connected to one end of the inductor. The circuit can be fabricated as a portion of an integrated circuit formed on a single semiconductor substrate.

In accordance with another broad aspect of the invention, a method for increasing the emitter-collector breakdown voltage of a bipolar transistor is presented in which the base and collector of the bipolar transistor are shorted when the emitter-collector voltage exceeds the open-base breakdown voltage by turning on a transistor connected between the base and collector of the bipolar transistor.

BRIEF DESCRIPTION OF THE DRAWING

The invention is illustrated in the accompanying drawings in which.

In the various figures of the drawing, like reference numerals are used to denote like or similar parts.

DETAILED DESCRIPTION OF A PREFERRED EMBODIMENT

Figure 1:
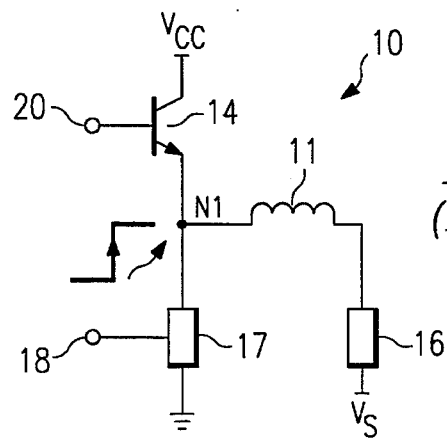
FIG. 1 is an electrical schematic diagram of a driver circuit to provide drive current to an inductor in accordance with the prior art, that has a breakdown voltage equal to the open-base breakdown voltage of the upper driver transistor.
Figure 2:
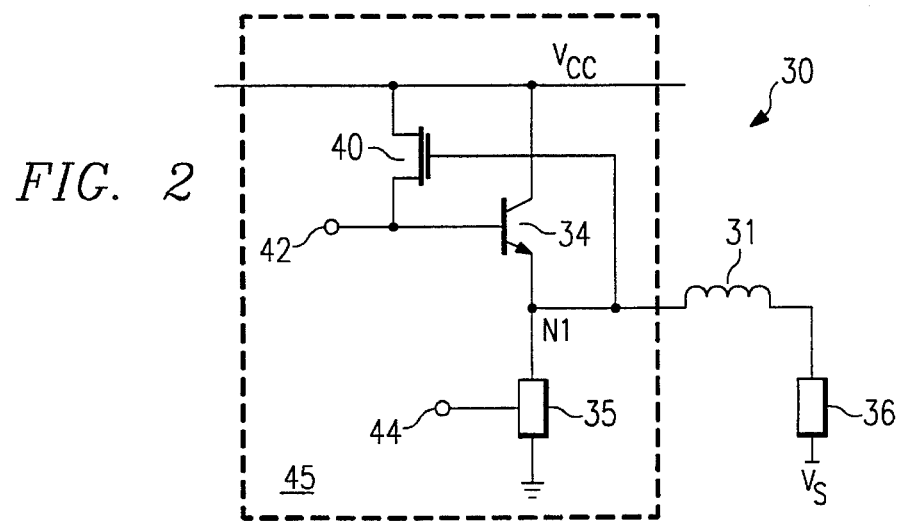
FIG. 2 is an electrical schematic diagram of a driver circuit in accordance with the present invention that has a breakdown voltage in excess of that of the FIG. 1 configuration.

With reference now to FIG. 2, a circuit 30, in accordance with the present invention, is provided for providing a drive current to an inductor 31 is shown. The circuit 30 includes an NPN driver transistor 34 having its collector connected to a supply voltage $V_{CC}$. The emitter of the driver transistor 34 is connected to one side of a switch 35 that is connected between the node N1 and a reference potential, or ground.

As before, the inductor 31 is connected between the node

N1 and other load elements 36. The additional load elements 36 can be, for example, resistive load elements or the like. The load elements 36 are connected to a reference voltage $V_S$.

In addition, an n-channel MOS transistor 40 is provided. The transistor 40 has its drain connected to the supply voltage $V_{CC}$ and its source connected to the input or base of the driver transistor 34. The gate of the transistor 40 is connected to the node N1. It should be noted that although an n-channel MOS transistor 40 is shown, a bipolar NPN transistor can be equally advantageously employed.

The input to the driver transistor 34 is connected to an input terminal 42. Likewise, the input to the lower switching transistor 35 is connected to an input terminal 44. Thus, in operation, when the lower transistor 35 is turned on by application of an appropriate input signal to the input terminal 44, current is allowed to flow from supply $V_S$ through the coil 31 and through the drain-source path of the transistor 35. The voltage appearing at node N1, therefore, will, in general, be equal to a value between $V_{CC}$ and ground. When, however, the transistor 35 is turned off, the voltage on node N1 will increase due to the current-to-voltage relationship imposed by the inductor 31. As the voltage on node N1 increases to a level above $V_{CC}$, it turns on the transistor 40 to effectively short the base and collector of the driver transistor 34. Therefore, the voltage on node N1 can safely climb to a higher voltage above the supply before any breakdown occurs, thus substantially increasing the breakdown voltage capability of the circuit beyond that merely provided by the driver transistor 34.

Thus, by virtue of the added N-channel MOS transistor 40, the base of transistor 34 is practically shorted to the collector as soon as the voltage on node N1 climbs over $(V_T)$ volts above the supply (where $V_T$ is the threshold voltage of transistor 40). In this condition the voltage on node N1 can safely climb up to $(BV_{EBO})$ volts above the supply before any breakdown occurs, thus substantially increasing such limit.

It will be appreciated that the circuit 30 can be used in dc motor driving applications, particularly in such applications in which high and low side drivers are provided. In such application, the driver transistor 34 can provide the so-called high side driver function, whereas the switch 35 can provide the low side driving function. Coil commutation signals can be applied to the respective input terminals 42 and 44 to control the switching operation of the transistor 34 and switch 35, in a manner known in the art.

It will be appreciated that the transistors 34 and 40 and switch 35 can easily be formed as a part of a single integrated circuit on a single substrate, denoted by the dotted line 45 in FIG. 2.

Figure 3:
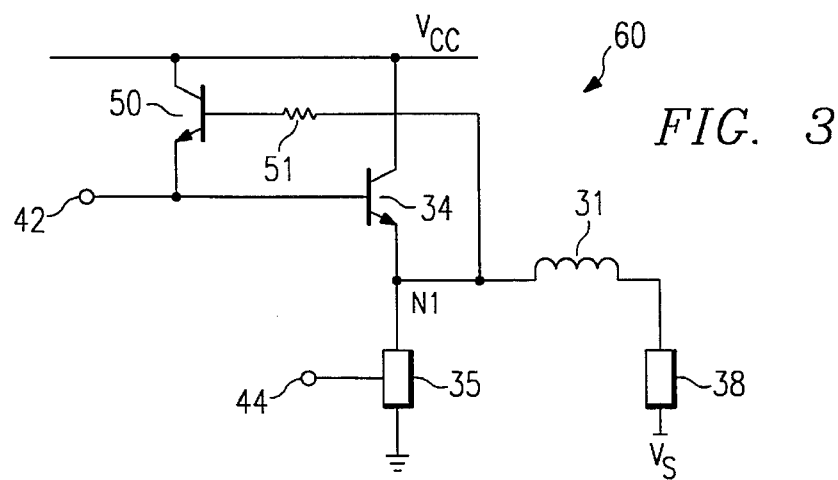
FIG. 3 is an electrical schematic diagram of an alternative embodiment of a driver circuit that has a breakdown voltage in excess of that of the FIG. 1 configuration.

Transistor 40 may also be substituted by an NPN bipolar transistor with a (relatively) large resistor in series with its base, as shown in FIG. 3. In the embodiment in which an NPN transistor is used in place of the n-channel MOS transistor 40 shown, a large resistor 51 is generally provided in series with the base of the NPN bipolar transistor. Thus, as shown in FIG. 3, a bipolar NPN transistor 50 is connected with its collector and emitter between the supply voltage, the $V_{CC}$ and the base of the driver transistor 34. A high value resistor 51 is connected between the base of the transistor 50 and the emitter of the driver transistor 34 at node N1.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A circuit for providing drive current to an inductor, comprising:

a first bipolar transistor connected to switchably apply a drive current from a supply voltage source to said inductor, said first bipolar transistor having a reverse open-base breakdown voltage, $BV_{CEO}$, between its emitter and collector;

a second transistor having a current path connected between the collector and base of said first transistor, said second transistor having a control element connected to the emitter of said first bipolar transistor, and being operative to establish a current path between the collector and base of said first transistor when a voltage on said emitter of said first transistor exceeds a voltage of said supply voltage source;

so that a voltage higher than said breakdown voltage, $BV_{CEO}$, of said first transistor can exist between the emitter and collector of said first transistor before said first bipolar transistor breaks down.

2. The circuit of claim 1 wherein said first bipolar transistor is an NPN transistor.

3. The circuit of claim 1 wherein said second transistor is a field effect transistor.

4. The circuit of claim 1 wherein said second transistor is an N-channel MOS transistor.

5. The circuit of claim 1 wherein said inductor is a coil of a dc motor.

6. The circuit of claim 5 further comprising a switch connected between said inductor and a reference potential to serve as a low side coil driver.

7. The circuit of claim 1 wherein said first bipolar transistor and said second transistor are a portion of an integrated circuit formed on a single semiconductor substrate.

8. A method for increasing the emitter-collector breakdown voltage of a bipolar transistor comprising:

shorting the base and collector of the bipolar transistor before the emitter-collector voltage exceeds the reverse breakdown voltage, $V_{CEO}$.

9. The method of claim 8 wherein said step of shorting the base and collector comprises turning on a transistor connected between the base and collector of the bipolar transistor.

10. The method of claim 8 wherein said step of shorting the base and collector comprises turning on a field effect transistor connected between the base and collector of the bipolar transistor.

11. The method of claim 8 wherein said step of shorting the base and collector comprises turning on an N-channel MOS transistor connected between the base and collector of the bipolar transistor.

12. The method of claim 8 wherein said step of shorting the base and collector comprises turning on an NPN bipolar transistor connected between the base and collector of the bipolar transistor.

13. The method of claim 12 further comprising providing a high value resistor in series with a base connection of said NPN bipolar transistor.

* * * * *